(12) United States Patent
Jeon et al.

(10) Patent No.: US 6,600,206 B2
(45) Date of Patent: Jul. 29, 2003

(54) HIGH VOLTAGE SEMICONDUCTOR DEVICE HAVING HIGH BREAKDOWN VOLTAGE ISOLATION REGION

(75) Inventors: Chang-ki Jeon, Kimpo (KR); Sung-Iyong Kim, Suwon (KR); Jong-jib Kim, Seoul (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 0 days.

(21) Appl. No.: 10/123,007

(22) Filed: Apr. 15, 2002

(65) Prior Publication Data

US 2002/0175392 A1 Nov. 28, 2002

(30) Foreign Application Priority Data

Apr. 16, 2001 (KR) ..................................... 2001-0020169

(51) Int. Cl.$^7$ ............................................. H01L 29/00
(52) U.S. Cl. ....................................... 257/500; 257/487
(58) Field of Search ................................. 257/500, 487, 257/496, 653, 401

(56) References Cited

U.S. PATENT DOCUMENTS 5,998,845 A * 12/1999 Ludikhuize ................. 257/401

* cited by examiner

*Primary Examiner*—Mark V. Prenty
(74) *Attorney, Agent, or Firm*—Thomas R. FitzGerald, Esq.

(57) ABSTRACT

A high voltage semiconductor device is provided. The high voltage semiconductor device includes a tow voltage region, a high voltage region, and a high breakdown voltage isolation region. The high voltage region is surrounded by the low voltage region and has corner portions at one side thereof. The high breakdown voltage isolation region has an isolation region for electrically separating the low and high voltage regions from each other and a lateral double diffused metal-oxide-semiconductor (DMOS) transistor for transmitting a signal from the low voltage region to the high voltage region. In particular, a drain region of the lateral DMOS transistor is disposed between the corner portions of the high voltage region, and opposite edges of the corner portions of the high voltage region and drain region of the lateral DMOS transistor are curved.

10 Claims, 5 Drawing Sheets

HIGH VOLTAGE SEMICONDUCTOR DEVICE HAVING HIGH BREAKDOWN VOLTAGE ISOLATION REGION

BACKGROUND OF THE INVENTION

This patent claims the benefit of the filing date of its corresponding Korean Patent Application No. 01-20169, filed Apr. 16, 2001.

1. Field of the Invention

The present invention relates to a high-voltage semiconductor device, and more particularly, to a high-voltage semiconductor device having a high-breakdown voltage isolation region.

2. Description of the Related Art

In general, power devices have been widely used in various applications including inverters or converters for controlling motors, various power sources and switches. Power devices are typically driven and controlled by electronic circuits constructed of interconnected semiconductor devices and electronic elements. The functions of power devices and the driving and controlling of power devices are performed by low-voltage integrated circuits (ICs) of several tens of volts and high-voltage ICs of several hundreds of volts. Power devices and drive and control circuits are integrated on a single substrate in order to reduce the overall size of power ICs. Thus, a power IC includes both low and high voltage regions.

FIG. 1 is a layout diagram illustrating an example of a high-voltage semiconductor device for driving power devices such as power metal oxide semiconductor field effect transistors (MOSFETs) or insulated-gate bipolar transistors (IGBTs). Referring to FIG. 1, the high-voltage semiconductor device includes a low voltage region I and a high voltage region II surrounded by the low voltage region I. Only a portion of the low voltage region I is shown in FIG. 1. A high-breakdown voltage isolation region is disposed between the low and high voltage regions I and II. The high-breakdown voltage isolation region is provided to electrically separate the two regions I and II from each other and shift the level of a signal from the low voltage region I in order to transmit the signal to the high voltage region II. The high-voltage isolation region has a lateral double diffused MOS (DMOS) transistor formed in an n-type drift region 10 and a p-type isolation region 11.

Reference numerals 12 and 13 denote a p-type well region and an n-type drain region of the lateral DMOS transistor, respectively.

FIG. 2 shows electric field lines in a portion "A" of the high-voltage semiconductor device of FIG. 1. Referring to FIG. 2, an electric field is highly concentrated on edges of the drain region 13 of the lateral DMOS transistor and edges of the high voltage region II, in particular, two opposite edges A' of the regions 13 and 11. This is because a spherical junction structure is formed on these edges. It is well known that an electric field is more concentrated at a region where a spherical junction is formed rather than a region where a planar junction or cylindrical junction is formed. The presence of a region where the electric field is dense significantly reduces a breakdown voltage and reduces the ruggedness of the device.

SUMMARY OF THE INVENTION

To solve the above problems, it is an objective of the present invention to provide a high-voltage semiconductor device having a high-breakdown voltage isolation region, which increases a breakdown voltage and improves the ruggedness of the device.

Accordingly, to achieve the above objective, the present invention provides a high-voltage semiconductor device having a low voltage region, a high voltage region, and a high-breakdown voltage isolation region. The high voltage region is surrounded by the low voltage region and has corner portions at one side thereof. The high breakdown voltage isolation region has an isolation region for electrically separating the low and high voltage regions from each other and a lateral double diffused metal-oxide-semiconductor (DMOS) transistor for transmitting a signal from the low voltage region to the high voltage region. In particular, a drain region of the lateral DMOS transistor is disposed between the corner portions of the high voltage region, and opposite edges of the corner portions of the high voltage region and drain region of the lateral DMOS transistor are curved. As such, the invention provides non-spherical junctions between corners of the drain and the high voltage region II Preferably, the edges of the corner portions of the high voltage region and the edges of the drain region of the lateral DMOS transistor have a substantially constant radius of curvature.

In this invention, it is preferable that the lateral DMOS transistor has n-type conductivity, and the isolation region has p-type conductivity.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
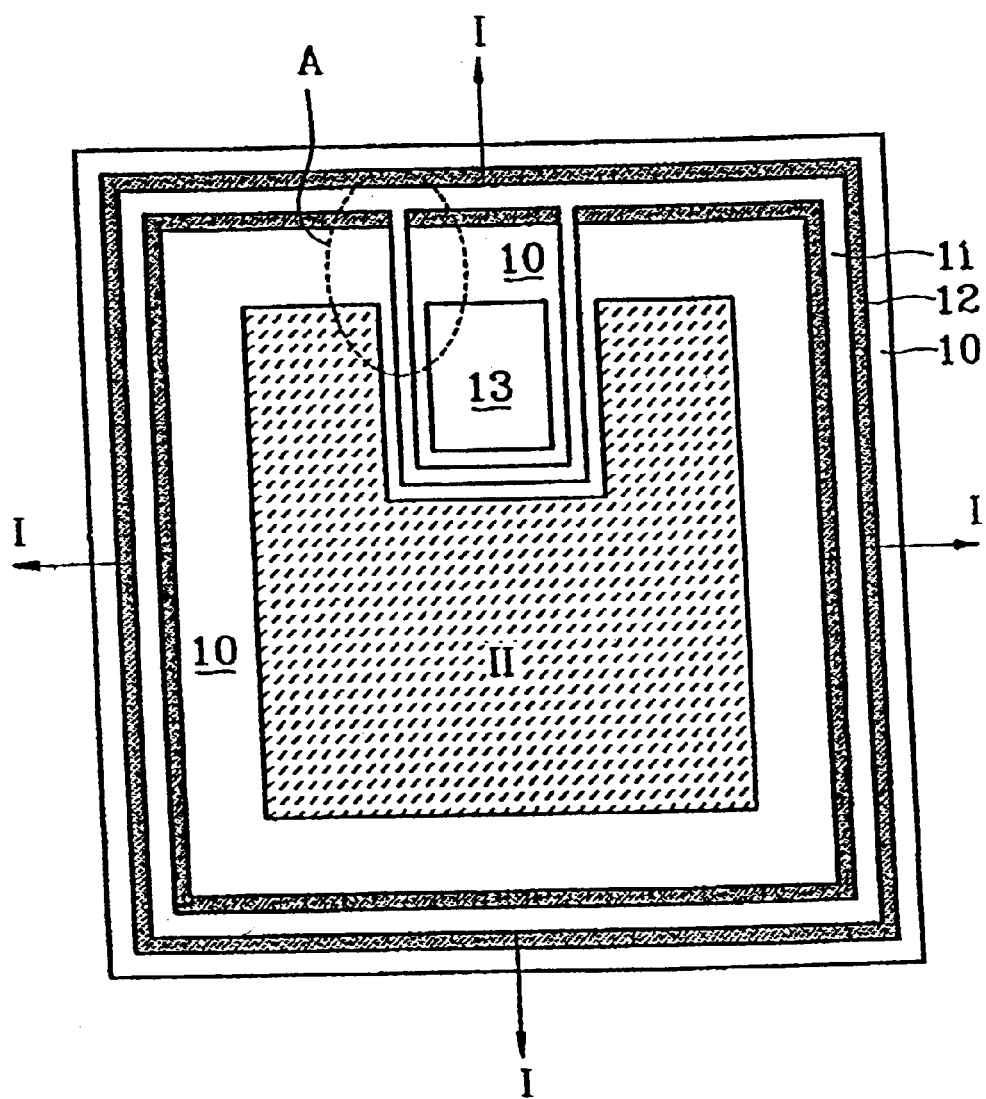
FIG. 1 is a layout diagram of a conventional high-voltage semiconductor device having a high-breakdown voltage isolation region.
Figure 2:
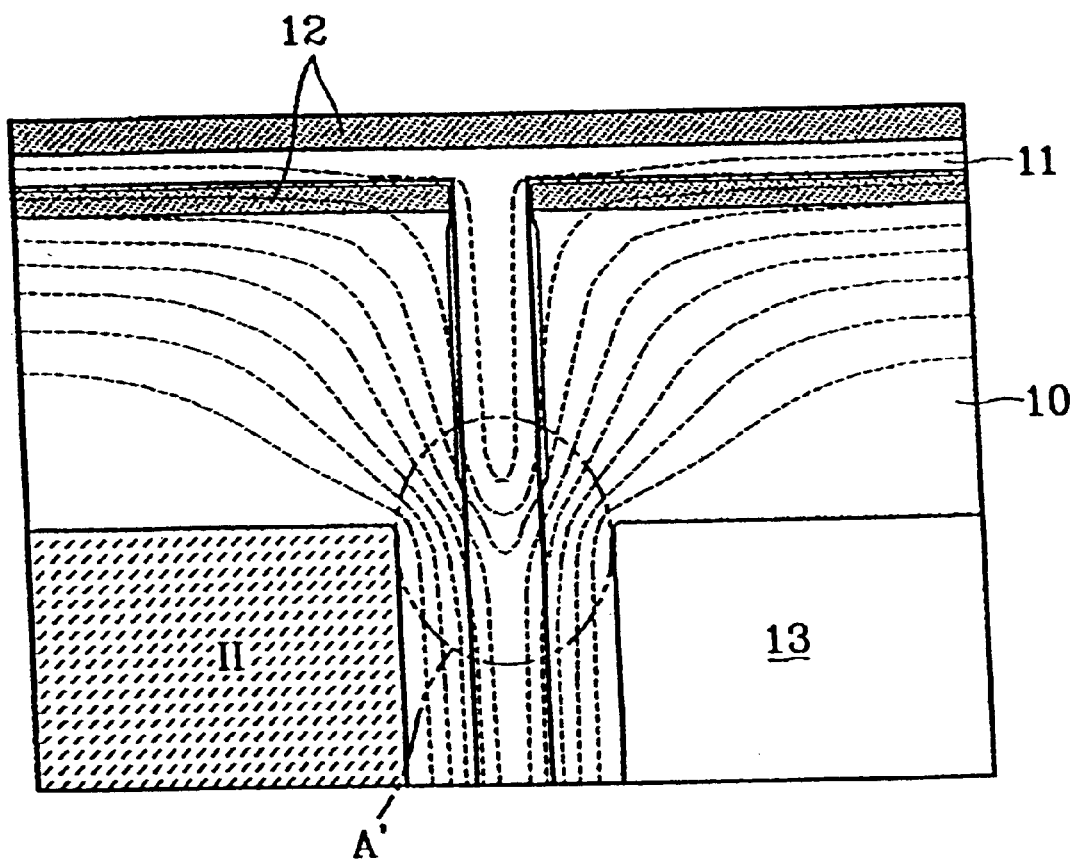
FIG. 2 shows electric field lines in a portion "A" of the high-voltage semiconductor device of FIG. 1.

Hereinafter, an embodiment of the present invention will be described in detail with reference to the attached drawings. The present invention is not restricted to the following embodiment, and many variations are possible within the spirit and scope of the present invention. For example, n-type regions may be p-type regions, and vice versa. The embodiment of the present invention is provided in order to more completely explain the present invention to anyone skilled in the art. In the drawings, the thickness of films is exaggerated for clarity and the same reference numerals denote the same element.

Figure 3:
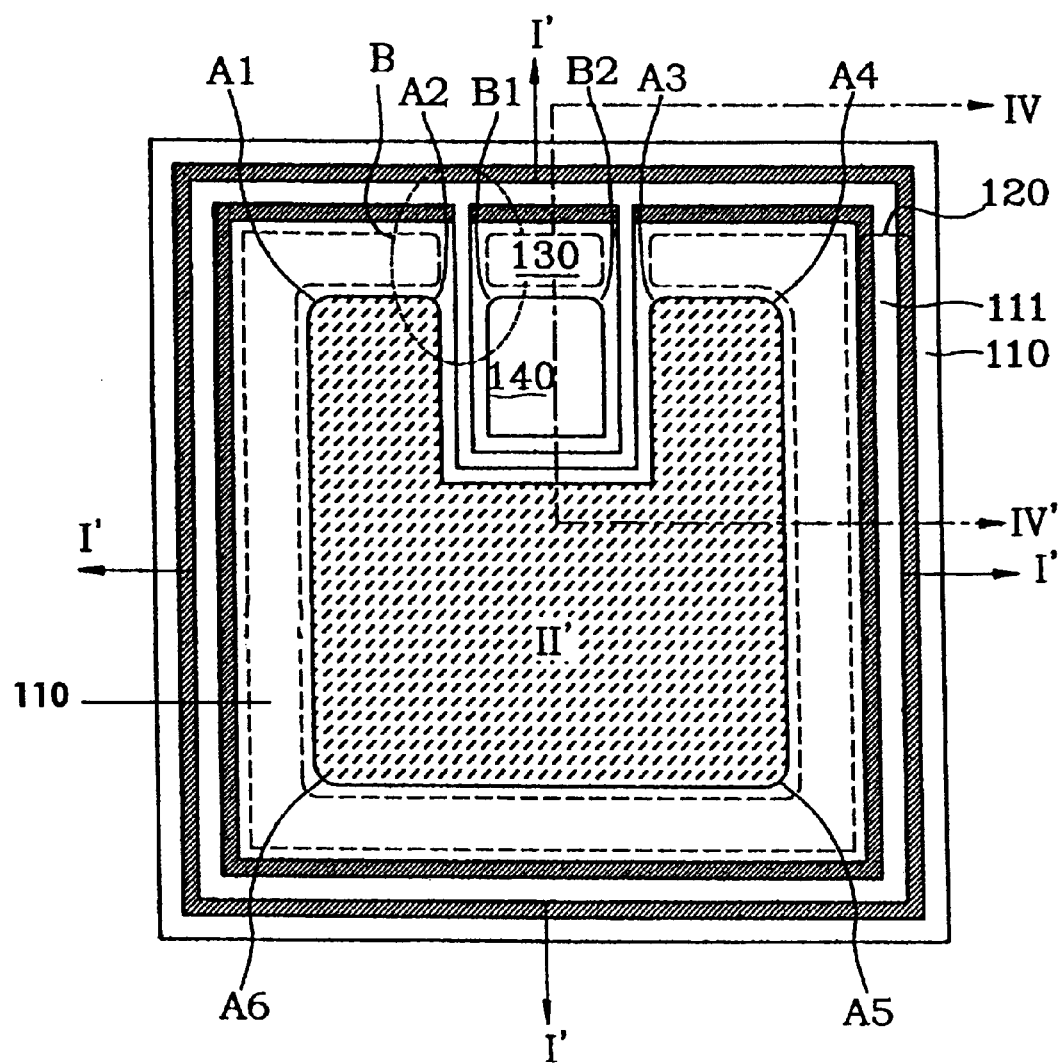
FIG. 3 is a layout diagram of a high-voltage semiconductor device having a high-breakdown voltage isolation region according to the present invention.
Figure 4:
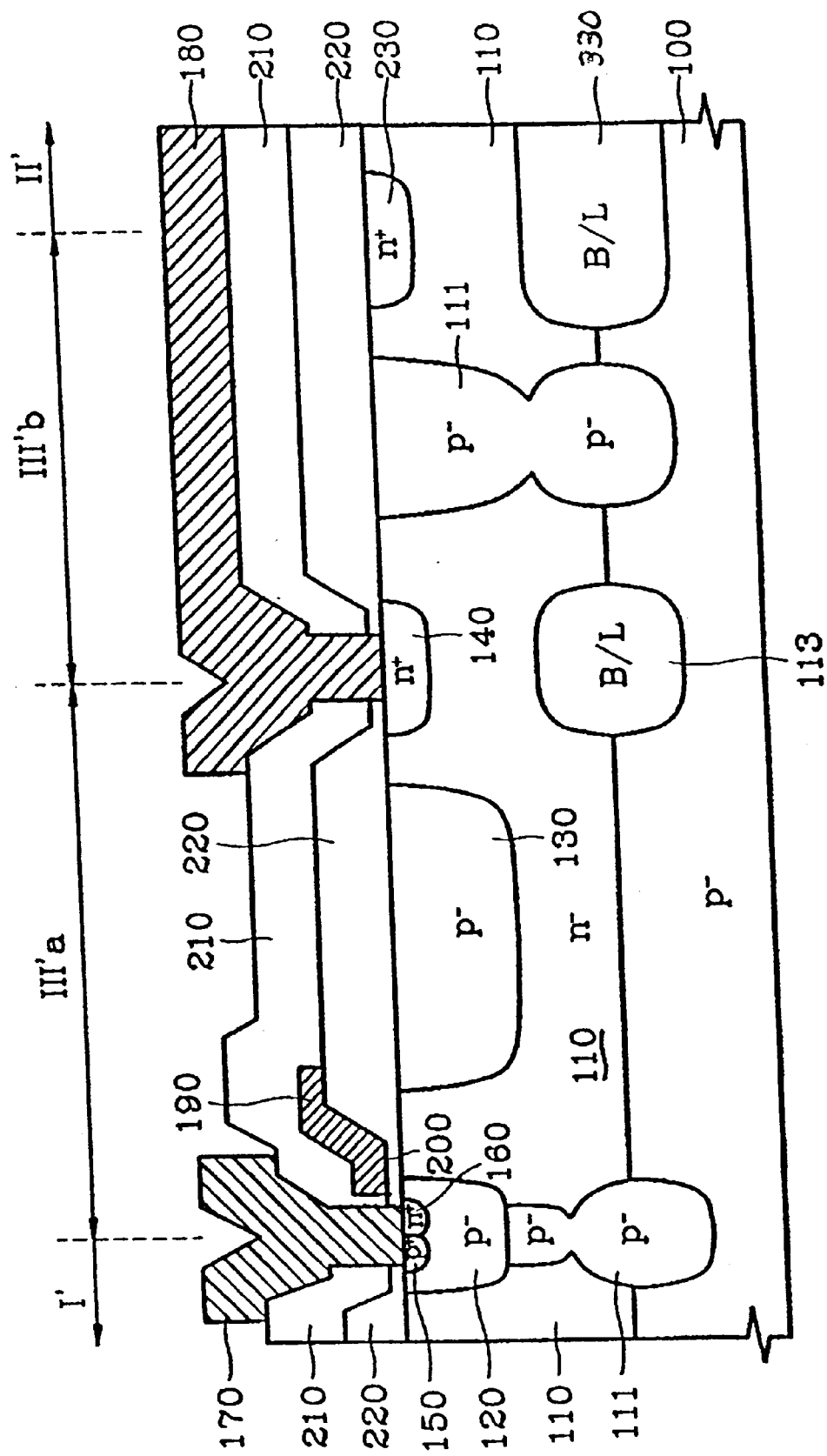
FIG. 4 is a cross-section taken along line IV–IV' of FIG. 3.

Referring to FIGS. 3 and 4, a high-voltage semiconductor device according to the present invention includes a low voltage region I', a high voltage region II', and high-breakdown voltage isolation regions that include a lateral DMOS transistor region III'a and an interconnection region III'b, all of which are formed on a semiconductor substrate 100 of a first conductivity type, for example, p-type. The high voltage region II' is surrounded by the high-breakdown voltage isolation regions III'a and III'b and the low voltage region I'. The high voltage region II' has rounded outer corners A1–A6. The corners A1–A6 are opposite the low voltage region I'. The region 140 of the LMDMOS has rounded corner C1 opposite high voltage rounded corner A1 and rounded corner C2 opposite high voltage corner A6. Several tens of volts are applied to the low voltage region I', whereas several hundreds of volts are applied to the high voltage region II'. The high-breakdown voltage isolation regions III'a and III'b electrically isolate the low and high voltage regions I' and II' from each other, while shifting the level of a signal received from the low voltage region I in order to transmit the signal to the high voltage region II'.

The high-breakdown voltage isolation regions III'a and III'b include a lateral double diffused MOS (DMOS) transistor III'a for signal shifting and an interconnection region III'b for connecting a signal from the low voltage portion I to the high voltage portion II. The lateral DMOS transistor III'a and the interconnection III'b are disposed adjacent to the low voltage region I' and the high voltage region II', respectively.

The lateral DMOS transistor III'a has a drift region 110 of a second conductivity type, for example, n⁻-type. A p⁻-type well region 120, a p⁻-type top region 130, and an n⁺-type drain region 140 are formed at in a predetermined upper region of the n⁻-type drift region 110, all of which are separated from one another a predetermined distance. A p⁺-type contact region 150 and an n⁺-type source region 160 are formed in the p⁻-type well region 120. A source electrode 170 is connected to the p⁺-type contact region 150 and the n⁺-type source region 160, and a drain electrode 180 is connected to the n⁺-type drain region 140. A gate electrode 190 is formed on a gate insulating layer 200 in a channel region formed on an edge of the p⁻-type well region 120 and in the n⁻-type drift region 110 between the p⁻-type well region 120 and a p⁻-type top region 130. For signal transmission, the drain electrode 180 extends to the high voltage region II'a across the interconnection III'b. The source electrode 170, the drain electrode 180, and the gate electrode 190 are insulated from one another by an insulating layer 210.

A p⁻-type isolation region 111 is disposed in the interconnection region III'b. The region 111 electrically isolates the high voltage region II' from the lateral DMOS transistor III'a. In addition, the p⁻-type isolation region 111 is connected through the n⁻-type drift region 110 to the bottom of the p-type well region 120 that is located at an interface between the low voltage region I' and the lateral DMOS transistor III'a. That connection electrically separates the low voltage region I' from the lateral DMOS transistor II'a. At the interface between the lateral DMOS transistor III'a and the interconnection III'b and in the high voltage region II', an n-type buried layer B/L 113 is formed at an interface between the semiconductor substrate 100 and the n-type drift region 110. Reference numeral 220 denotes an isolation layer. An n+-type impurity region 230 is formed at the interface between the interconnection III'b and the high voltage region II'.

Figure 5:
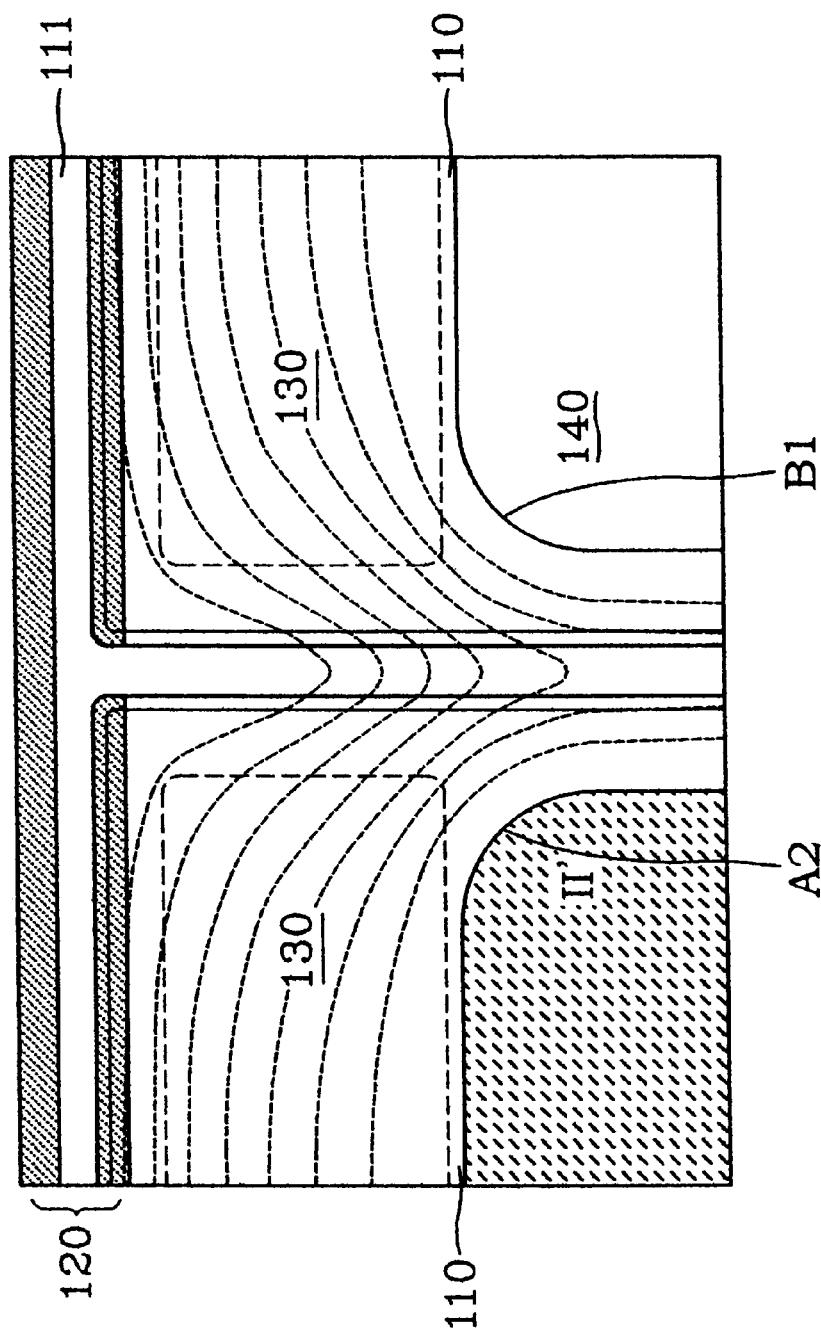
FIG. 5 shows electric field lines in a portion "B" of the high-voltage semiconductor device of FIG. 3.

FIG. 5 shows electric field lines in a portion "B" of the high-voltage semiconductor device of FIG. 3. As shown in FIG. 5, corner portions are formed in an upper portion of the high voltage region II' so as to oppose both sides of the drain region 140 of the lateral DMOS transistor III'a. The p⁻-type isolation region 111 is disposed between the high voltage region II' and the drain region 140. In this configuration, edges of the corner portions and edges of the lateral DMOS transistor III'a are curved and oppose each other in both directions of the p-type isolation region 111. These curved edges significantly reduce electric field density as shown by the dotted field lines. The curved edges result in no-spherical p/n junctions in the drift region. It is preferable that the curved portions have a round shape since the round shape can reduce electric field density as much as possible. As the electric field density decreases in this way, a breakdown voltage of a device increases.

As described above, in the high-voltage semiconductor device having a high breakdown voltage isolation region according to the present invention, edges of the high voltage region and edges of the lateral DMOS transistor, at which electric field is concentrated, are formed in a curved shape, thereby reducing electric field density as much as possible and thus increasing a breakdown voltage of the device. Those skilled in the art will understand that variations, modifications, addition and deletions may be made to the particular structures shown above without departing from the spirit and scope of the claimed invention. For example, the radius of curvature of the corners may be constant or variable.

What is claimed is:

1. A high voltage semiconductor device comprising:

a high voltage transistor, and a low voltage region surrounding the high voltage transistor and an isolation region disposed between the low voltage region and the high voltage transistor, said high voltage transistor having corner portions at one side thereof with the corner portion facing each other and separated from each other by a portion of the isolation region, the isolation region disposed between the low voltage region and the high voltage transistor for electrically separating the low voltage region from the high voltage transistor, said isolation region comprising a lateral double diffused metal-oxide-semiconductor (LDMOS) transistor for transmitting a signal from the low voltage region to the high voltage transistor, said LDMOS having a drain region disposed between the opposite corner portions of the high voltage transistor region, said LDMOS drain region having a pair of corners with each corner facing an opposing corner of the high voltage transistor and wherein the opposite corners of the high voltage transistor and drain region of the lateral LDMOS transistor are curved to reduce the electric field between the high voltage transistor and the drain of the LDMOS.

2. The high voltage semiconductor device of claim 1, wherein the edges of the corner portions of the high voltage transistor and the edges of the drain region of the lateral DMOS transistor have a substantially constant radius of curvature.

3. The high voltage semiconductor device of claim 1, wherein the lateral DMOS transistor has n-type conductivity.

4. The high voltage semiconductor device of claim 3, wherein the isolation region has p-type conductivity.

5. The high voltage semiconductor device of claim 1 wherein corners of the high voltage transistor opposite the low voltage region are rounded.

6. A smart power device comprising:

a central high voltage transistor having a power semiconductor device with first and second corners spaced from each other by a portion of an electrical isolation region;

a peripheral low voltage region surrounding the central high voltage region;

the electrical isolation region disposed between the central high voltage region and the peripheral low voltage region, said electrical isolation region including an LDMOS device and an interconnect region, the LDMOS device connected at is source to the low voltage region and at its drain to interconnect region, the interconnect region connected to the central high voltage transistor, said LDMOS device and said interconnect region for transmitting a signal from the peripheral low voltage region to the central high voltage transistor and maintaining electrical isolation between the two regions, said LDMOS device having a drain with first and second corners, wherein the first corners of the drain the high voltage transistor are opposite each of the first and second corners of the LMDMOS device and the four corners are rounded for reducing an electric field between opposite corners to increase the breakdown voltage of the device.

7. The smart power device of claim 6 wherein the corners comprise a contour of a fixed radius.

8. The smart power device of claim 6 wherein the corners comprise a contour of a variable radius.

9. The smart power device of claim 6 wherein the corners of the high voltage transistor opposite the low voltage region are rounded.

10. A smart power device comprising:

a central high voltage region having a power semiconductor device with first and second corners spaced from each other by a portion of an electrical isolation region;

a peripheral low voltage region surrounding the central high voltage region;

the electrical isolation region disposed between the central high voltage region and the peripheral low voltage region, said electrical isolation region including the LDMOS device and an interconnect region, the LDMOS device connected at is source to the low voltage region and at its drain to interconnect region, the interconnect region connected to the central high voltage region, said LDMOS device and said interconnect region for transmitting a signal from the peripheral low voltage region to the central high voltage region and maintaining electrical isolation between the two regions, said LDMOS device having a drain with first and second corners, wherein the first corners of the drain the high voltage region are opposite each other and the second corners of the drain and the high voltage region are opposite each other, and the four corners are rounded with a variable radius of curvature for reducing an electric field between opposite corners to increase the breakdown voltage of the device.

* * * * *